(12) United States Patent
Ehm et al.

(10) Patent No.: US 8,419,862 B2
(45) Date of Patent: Apr. 16, 2013

(54) METHOD FOR REMOVING A CONTAMINATION LAYER FROM AN OPTICAL SURFACE AND ARRANGEMENT THEREFOR AS WELL AS A METHOD FOR GENERATING A CLEANING GAS AND ARRANGEMENT THEREFOR

(75) Inventors: Dirk Heinrich Ehm, Lauchheim (DE); Arnold Storm, Delft (NL); Johannes Hubertus Josephina Moors, Helmond (NL); Bastiaan Theodoor Wolschrijn, Abcoude (NL); Thomas Stein, Oberkochen (DE); Edwin te Sligte, Eindhoven (NL)

(73) Assignees: Carl Zeiss SMT GmbH, Oberkochen (DE); ASML Netherlands B.V., Veldhoven (NL)

( * ) Notice: Subject to any disclaimer, the term of this patent is extended or adjusted under 35 U.S.C. 154(b) by 260 days.

(21) Appl. No.: 12/662,840

(22) Filed: May 6, 2010

(65) Prior Publication Data
US 2010/0288302 A1 Nov. 18, 2010

Related U.S. Application Data

(63) Continuation of application No. PCT/EP2007/009593, filed on Nov. 6, 2007.

(51) Int. Cl.
*B08B 5/00* (2006.01)
*A47L 5/05* (2006.01)

(52) U.S. Cl.
USPC ....... 134/37; 134/102.2; 250/251; 250/492.1; 15/300.1; 15/301; 15/312.1; 15/316.1; 15/405

(58) Field of Classification Search ............... 134/1, 1.1, 134/1.2, 19, 20, 37; 250/251, 423 R, 425, 250/492.1, 493.1; 15/300.1, 312.1, 316.1, 15/405

See application file for complete search history.

(56) References Cited

U.S. PATENT DOCUMENTS

| 6,192,897 B1 | 2/2001 | Klebanoff et al. |
| 7,050,152 B2 | 5/2006 | Terashima et al. |

(Continued)

FOREIGN PATENT DOCUMENTS

| DE | 102007037942 | 2/2009 |
| EP | 1 431 828 | 6/2004 |

(Continued)

OTHER PUBLICATIONS

English translation of the Office action of the Japanese Patent Office dated Mar. 27, 2012 in the corresponding Japanese patent application 2010-532437.

(Continued)

*Primary Examiner* — Saeed T Chaudhry
(74) *Attorney, Agent, or Firm* — Walter Ottesen

(57) ABSTRACT

The invention is directed to a method for at least partially removing a contamination layer (15) from an optical surface (14*a*) of an EUV-reflective optical element (14) by bringing a cleaning gas into contact with the contamination layer. In the method, a jet (20) of cleaning gas is directed to the contamination layer (15) for removing material from the contamination layer (15). The contamination layer (15) is monitored for generating a signal indicative of the thickness of the contamination layer (15) and the jet (20) of cleaning gas is controlled by moving the jet (20) of cleaning gas relative to the optical surface (14*a*) using this signal as a feedback signal. A cleaning arrangement (19 to 24) for carrying out the method is also disclosed. The invention also relates to a method for generating a jet (20) of cleaning gas and to a corresponding cleaning gas generation arrangement.

8 Claims, 4 Drawing Sheets

U.S. PATENT DOCUMENTS

| | | |
|---|---|---|
| 7,196,769 B2 | 3/2007 | Miyajima |
| 2003/0051739 A1 | 3/2003 | Klebanoff et al. |
| 2004/0156052 A1 | 8/2004 | Yamamoto et al. |
| 2004/0165160 A1 | 8/2004 | van Beek et al. |
| 2004/0211448 A1 | 10/2004 | Klebanoff et al. |
| 2004/0218157 A1 | 11/2004 | Bakker et al. |
| 2005/0045213 A1 | 3/2005 | Blanco et al. |
| 2007/0069160 A1* | 3/2007 | Banine et al. ............. 250/504 R |
| 2007/0091287 A1 | 4/2007 | Chang et al. |
| 2007/0145297 A1* | 6/2007 | Freriks et al. .............. 250/492.2 |
| 2011/0048452 A1* | 3/2011 | Zink et al. ..................... 134/1 |

FOREIGN PATENT DOCUMENTS

| | | |
|---|---|---|
| EP | 1 643 310 | 4/2006 |
| WO | WO 2004/104707 | 12/2004 |
| WO | WO-2004/104707 | * 12/2004 |

OTHER PUBLICATIONS

English translation of the Office action of the Japanese Patent Office dated Jan. 4, 2013 in the corresponding Japanese patent application 2012-206709.

* cited by examiner

METHOD FOR REMOVING A CONTAMINATION LAYER FROM AN OPTICAL SURFACE AND ARRANGEMENT THEREFOR AS WELL AS A METHOD FOR GENERATING A CLEANING GAS AND ARRANGEMENT THEREFOR

CROSS REFERENCE TO RELATED APPLICATION

This application is a continuation application of international patent application PCT/EP 2007/009593, filed Nov. 6, 2007, designating the United States and the entire content thereof is incorporated herein by reference.

FIELD OF THE INVENTION

The invention relates to a method for at least partially removing a contamination layer from an optical surface of an EUV-reflective optical element by bringing a cleaning gas, preferably comprising atomic hydrogen, into contact with the contamination layer. The invention also relates to a cleaning arrangement for carrying out the method. A method is also disclosed for generating a jet of cleaning gas, preferably comprising atomic hydrogen, to be directed to a contamination layer on an optical surface of an EUV-reflective optical element. In addition, a corresponding cleaning gas generation arrangement as well as an EUV-lithography system are presented.

BACKGROUND OF THE INVENTION

Lithography exposure systems for the EUV wavelength range (from about 5 nm to about 20 nm) generally comprise an EUV light source, an illumination system for homogeneously illuminating a pattern arranged on a mask with light from the EUV source, and a projection system for imaging the pattern onto a photosensitive substrate (wafer). In the present application, the term "light" designates electromagnetic radiation at wavelengths which are not restricted to the visible domain, i.e. the term "light" will be used also for radiation in the EUV or VUV wavelength range.

During the exposure process, a contamination layer containing mainly carbon grows on the optical surfaces of the optical elements of the EUV-lithography system. The formation of the contamination layer is triggered by radiation-induced cracking of hydrocarbon molecules, the presence of which cannot be avoided even though the compartments of the EUV-lithography system are operated under vacuum conditions. The contaminating material, in particular carbon, can be cleaned away by bringing the contamination layer on the optical surfaces into contact with a cleaning gas, such as atomic hydrogen. Currently, it is foreseen to equip each EUV-reflective element of a EUV lithography system with one hydrogen radical generator (HRG), such that cleaning can be performed in-situ, i.e. without removal of the optical elements from the EUV-lithography system. In the present application, the term "atomic hydrogen" is used for all types of activated hydrogen ($H_2$), i.e. not only designating hydrogen in the form of hydrogen radicals H•, but also hydrogen ions such as $H^+$ or $H_2^+$ or hydrogen H* in an excited (electron) state.

In general, the amount of material removed from the contamination layer by the cleaning gas cannot be precisely determined. Consequently, the cleaning time during which the cleaning gas should be brought into contact with the contamination layer is only approximately known. In case that the cleaning time is too short, part of the contamination layer will not be removed from the optical surface, causing an unwanted reflection loss even after the cleaning. Therefore, for ensuring that the entire contamination layer is removed by the cleaning, a cleaning time may be chosen which is too long (so-called "overcleaning") so that, especially close to the end of the cleaning process, part of the cleaning gas may come into contact with the optical surface. As the optical surface in general also reacts with the cleaning gas, an irreversible contamination is caused on the optical surface in a low amount per cleaning cycle. As only 1% reflection loss due to irreversible contamination is permitted over the lifetime of a EUV-reflective element, the lifetime of the optics of a EUV-lithography system is determined by the mean time between successive cleaning processes multiplied by the number of allowed cleaning cycles.

In the publication US 2003/0051739 A1, a device for removing carbon contaminations from an optical surface of a mirror element in a EUV lithography system is disclosed. In one example, the device comprises two cleaning gas generators, each for generating a jet of cleaning gas which is directed to the optical surface. In another example, a single cleaning gas generator of cylindrical shape is used which is situated around the perimeter of the mirror. The cleaning gas is generated by activation of a supply gas using accelerated electrons which are produced by thermoemission from a heated filament.

WO 2004/104707 A2 discloses a method for in-situ cleaning of an optical surface of an optical element for EUV or soft X-ray radiation which is arranged in a vacuum vessel, the optical surface being contaminated with an inorganic substance introduced by a radiation source. In the method, at least one reagent which is substantially translucent or transparent to the radiation (such as molecular hydrogen) is added through a supply system of a vacuum vessel, depending on the prevailing conditions. The reagent chemically reacts with the contaminants to remove them from the optical surface. The reagent may be activated by irradiation with an activation light source and may be generated in a pulsed manner. The method may also be electronically controlled, e.g. by taking the thickness of the contamination layer into account.

SUMMARY OF THE INVENTION

It is an object of the invention to provide a method for at least partially removing a contamination layer from an optical surface of an EUV-reflective element, a method for generating a cleaning gas, as well as a corresponding cleaning arrangement and a corresponding cleaning gas generation arrangement, all of which are suitable for reducing or avoiding damage to the optical surface of the EUV-reflective element which may otherwise be caused by the cleaning process.

According to a first aspect, a method as described in the introduction is provided, the method comprising the steps of: directing a jet of cleaning gas to the contamination layer for removing material from the contamination layer, monitoring the contamination layer for generating a signal indicative of the thickness of the contamination layer, and controlling the jet of cleaning gas by moving the jet of cleaning gas relative to the optical surface, using the signal indicative of the thickness of the contamination layer as a feedback signal.

In the method proposed above, by monitoring the thickness of the contamination layer and using the thickness of the contamination layer as feedback information for controlling the jet of cleaning gas, the information about the actual thickness of the contamination layer is available during the entire cleaning process. In such a way, it is possible to take appropriate measures to avoid damaging of the optical surface which may be caused when the cleaning gas is brought into contact with the optical surface. In particular, in case that the thickness of the contamination layer falls below a given threshold, the cleaning can e.g. be slowed down by reducing the flow of cleaning gas to the optical surface, or the choice of the cleaning gas or of the cleaning method may be controlled in dependence of the thickness of the contamination layer, i.e. using more abrasive cleaning methods when the thickness of the contamination layer is comparatively large and resorting to less aggressive cleaning methods when the thickness of the contamination layer is reduced during the cleaning. In such a way, the cleaning can be accelerated while still avoiding irreversible contaminations of the optical surface caused by the cleaning gas.

During the illumination process, the contamination layer may grow on the optical surface with a thickness distribution showing a local variation depending on the position on the optical surface, yet, as such a thickness variation may be moderate in some cases, as a first approximation, a contamination layer with a homogeneous thickness distribution may be assumed. In this case, i.e. when the contamination layer on the optical surface is sufficiently homogeneous, monitoring of the thickness of the contamination layer in only one point on the optical surface may be sufficient. However, in case that the contamination layer has an inhomogeneous distribution over the optical surface, it is advisable to measure the thickness in a spatially resolved way, preferably by monitoring the thickness distribution of the contamination layer at each point of the optical surface.

It is to be understood that in the present application, the term "contamination layer" does not necessarily refer to a continuous layer of material deposited on the optical surface, i.e. the term "contamination layer" also encompasses contamination distributions with a discontinuous structure, e.g. forming contaminating spots or areas on the optical surface which are not connected to each other. Also, the term "control" is used herein both for open-loop and closed-loop control.

In a preferred variant, the movement of the jet of cleaning gas is controlled by displacing or by changing the direction of the jet of cleaning gas relative to the optical surface. By performing a translatory motion or by tilting/rotating the jet of cleaning gas, the location of the impact zone of the jet of cleaning gas on the contamination layer can be controlled, thus allowing removing material from the contamination layer in a dedicated, i.e. spatially resolved manner. Alternatively or in addition, it is possible to modify the shape and size of the impact zone of the jet of cleaning gas on the contamination layer, e.g. by changing the direction of the jet of cleaning gas or by modifying the distance between a source of cleaning gas (e.g. a cleaning head) and the optical surface. In contrast to this, in the state of the art, only a single static cleaning head is used, which due to the characteristics of the jets of cleaning gas only allows for cleaning in an inhomogeneous way, such that an unequal amount of material is removed from different areas of the contamination layer. Therefore, even with a contamination layer having essentially constant thickness, cleaning is performed in an inhomogeneous manner, i.e. in some areas more material is removed as compared to others. Therefore, in the state of the art, in order to remove the entire contamination layer from the optical element, an over-cleaning of the optical surface cannot be avoided, as for entirely removing the contamination layer also in those areas where less material is removed per time unit, those areas where more material is removed will already be free from contaminations, such that the cleaning gas is inevitably brought into contact with the optical surface in those areas.

In a preferred further development, the jet of cleaning gas is displaced or tilted in a scanning manner relative to the optical surface. In this way, the material of the contamination layer can be removed from the optical surface in a systematic way. Preferably, the size of the impact zone of the jet of cleaning gas on the optical surface is relatively small, e.g. about 10% or 5% of the overall area of the optical surface, allowing one to remove the material from the optical surface in a dedicated way, thus increasing the uniformity of the cleaning, and, in particular, adapting the amount of locally removed material in dependence of the local thickness of the contamination layer.

In a highly preferred variant, at least one further jet of cleaning gas is directed to the contamination layer for removing material from the contamination layer. Using two or more jets of cleaning gas simultaneously allows one to speed up the cleaning, as the amount of cleaning gas per time unit which can be produced in a cleaning head is limited due to technical constraints, leading to a cleaning rate of typically about 0.05 nm/min when using atomic hydrogen as cleaning agent. Thus, in case that the exposure process has to be interrupted for the cleaning process, the downtime of the EUV system required for the cleaning can be reduced. The use of more than one cleaning head is therefore particularly useful for EUV-reflective elements which are arranged at the beginning of the optical path, i.e. close to the EUV light source, as these elements are exposed to EUV radiation with the highest radiation intensity throughout the EUV system and thus the contamination layers on their optical surfaces have a comparatively large thickness.

Moreover, the use of more than one jet of cleaning gas is advantageous as the uniformity of the cleaning process can be improved, since the jets of cleaning gas may be activated selectively, e.g. activating only one jet at a time, or activating several or all jets simultaneously during different time intervals of the cleaning process. In particular, using two, preferably three or more jets of cleaning gas distributed around the perimeter of the optical surface has been proven to be highly advantageous.

In a further preferred variant, the thickness of the contamination layer is monitored by generating a map of the thickness distribution of the contamination layer. Such a map may be generated by directing monitoring light to at least a sub-region, preferably to the entire optical surface and measuring the intensity of the light which is reflected from the optical surface, respectively from the contamination layer, in a spatially resolving detector, the intensity of the reflected light being indicative of the thickness of the contamination layer. Alternatively, the monitoring light may be directed to a single point on the optical surface, the location of which may be changed by displacing or tilting/rotating the source of monitoring light relative to the optical surface, such that the map can be generated in a scanning manner. In a further alternative variant, in case that the cleaning head for generating the jet of cleaning gas is displaced laterally relative to the optical surface and the jet of cleaning gas is essentially directed at a right angle to the optical surface, the monitoring light source and the (not necessarily spatially resolving) detector may be displaced together with the cleaning head, e.g. by arranging them at appropriate locations next to the cleaning head, thus measuring the thickness of the contamination layer in the currently processed impact zone, which may be sufficient when the cleaning is performed in a scanning manner.

In a highly preferred variant, the method comprises the further step of generating the cleaning gas, the generation rate of the cleaning gas being controlled in dependence of the thickness of the contamination layer. In this way, the amount of cleaning gas per time unit may be reduced when the thickness of the contamination layer falls below a critical value. In the state of the art, as the actual thickness of the contamination layer during the measurement is unknown, the generation rate of the cleaning gas is kept essentially constant during the cleaning process, i.e. normally the maximum possible generation rate is used.

In a further highly preferred variant, atomic hydrogen is used as a cleaning gas when the thickness of the contamination layer falls below a pre-determined thickness, preferably a thickness of 10 nm, more preferably a thickness of 5 nm, in particular a thickness of 1 nm. As atomic hydrogen cleaning is not a very aggressive cleaning method, more aggressive cleaning methods may be used for speeding up the removal of, material from the contamination layer until the pre-determined thickness is reached. Such aggressive and fast cleaning methods such as mechanical cleaning using e.g. a blade or sputtering using a sputter gas of high atomic mass may be destructive to the topmost layer (cap layer) of the multilayer system even in case that a contamination layer with a small thickness is still present on the optical surface. Therefore, it is advisable to remove the remnant of the contamination layer using a less aggressive cleaning method, e.g. by atomic hydrogen cleaning, which can be very effectively used for this purpose. It is understood that, as the thickness of the contamination layer may vary over the optical surface, the choice of the cleaning gas or cleaning method can be made in dependence of the local thickness of the contamination layer.

In a highly preferred further development, before atomic hydrogen is used as a cleaning gas, material is removed from the contamination layer by another cleaning method, preferably selected from the group consisting of: sputtering, preferably using hydrogen, helium, argon, neon, or krypton as a sputter gas, mechanical cleaning by contact methods, heating induced desorption, and chemical cleaning. When sputtering is used as a cleaning method, a sputter gas is ionized and the ions of the sputter gas are then accelerated in an electrical field and directed to the optical surface of the EUV-reflective element for removing the contaminations. Using a sputter gas with a relatively low atomic mass increases the selectivity for carbon contaminants. The larger the atomic mass of the sputter gas, the higher the probability to remove other materials from the optical surface as well, e.g. ruthenium from the cap layer, or silicon or molybdenum from the layers beneath the cap layer. Therefore, the sputter gas may be selected in dependence of the instantaneous thickness of the contamination layer, e.g. starting the cleaning process with a sputter gas with a higher atomic mass and subsequently switching over to a sputter gas with a smaller atomic mass when the thickness of the contamination layer is reduced during the cleaning. Mechanical cleaning, e.g. using a scraper, chemical cleaning, e.g. by bringing a suitable cleaning agent (which dissolves carbon) into contact with the optical surface, or heating-induced desorption, i.e. heating up the environment of the EUV reflective element or the optical surface of the EUV-reflective optical element itself either homogeneously or locally, the latter e.g. by using a laser source as a heat source, directing radiation to a spot-like area on the optical surface. In general, in order to protect the optical surface, these methods should not be used when the thickness of the contamination layer falls below a critical value.

In a further preferred variant, the cleaning is performed during irradiation of the EUV-reflective optical element with EUV radiation. In this case, the entities which produce the jet(s) of cleaning gas as well as the entities which are used for monitoring the thickness of the optical surface are necessarily arranged outside of the optical path of the EUV light, thus allowing the cleaning process to be performed "in operando". It is understood that the cleaning process may also be performed during the downtime of the EUV-lithography system. This may be the case when the space in the EUV lithography system which is required for arranging the above-described entities outside of the optical path is insufficient, which may be the case for certain mirrors in the EUV lithography system.

In a highly preferred embodiment, the jet of cleaning gas is controlled for removing the entire contamination layer from the optical surface. In this case, by using the feedback from the monitoring unit, even contamination layers with a very irregular thickness distribution may be removed from the optical surface without damaging the latter.

In a preferred alternative variant, the jet of cleaning gas is controlled for removing only part of the material of the contamination layer, the distribution of the material of the contamination layer after the cleaning having a desired shape. A locally varying thickness distribution of the contamination layer leads to a locally varying reflectance of the EUV-reflective optical element. Therefore, by only selectively removing material from the contamination layer, e.g. removing material only in selected sub-regions of the optical surface, a desired optical property of the EUV-reflective optical element can be generated, i.e. the desired shape of the contamination layer can be chosen such that system parameters of the EUV lithography system such as telecentricity, transmission, uniformity, ellipticentricity, etc. are optimized. The desired shape of the contamination layer can be determined in a previous step by either using calculations or measurements of the optical properties of the EUV-lithography system.

In a preferred variant, the EUV-reflective element is arranged in an EUV-lithography system, and a signal indicative of at least one optical characteristic of the EUV-lithography system is determined and is used as an input signal for controlling of the jet of cleaning gas, the optical characteristic being preferably chosen from the group consisting of: telecentricity, transmission, uniformity, ellipticity, and wavefront error. In such a way, one or more signals generated by measurement equipment which is typically provided inside the EUV-lithography system for performing system measurements, e.g. measuring the intensity distribution of the EUV radiation at the waver level using appropriate sensors (e.g. so-called slit sensors), may be used for determining the desired shape of the contamination layer. Moreover, such a signal may also be used e.g. for determining when the initiation of a cleaning process of one or a plurality of EUV-reflective optical elements inside of the EUV-lithography system is required.

A further aspect of the invention is implemented in a method as described in the introduction, the method comprising the step of: controlling the generation rate of the cleaning gas in a pulsed manner, the time duration of the cleaning gas pulses and the time duration between subsequent cleaning gas pulses being controlled such that the cleaning of the EUV-reflective optical element is optimized. By selecting both the time duration of each cleaning gas pulse and the time duration between the pulses in a specific way, the cleaning can be optimized, as will be described in greater detail below.

In a highly preferred variant, the time duration of the cleaning gas pulses and the time duration between subsequent cleaning gas pulses are controlled such that a maximum temperature at or in the vicinity of the EUV-reflective element is not exceeded. When bringing a cleaning gas into contact with the contamination layer, through the chemical reaction of the cleaning gas with the contamination layer, the optical surface beneath is heated up. As the materials which constitute the multilayer system of the EUV-reflective element on which the optical surface is formed may be damaged due to excessive heating, it is proposed to control the generation rate of the cleaning gas, i.e. generating less cleaning gas in case that the temperature of the EUV-reflective element or the temperature in the vicinity of the optical element attains a given (maximum) value. In case that the instantaneous temperature of the EUV-reflective optical element needs to be determined, a temperature sensor which generates a feedback signal for the control may be used. Alternatively, it is possible to determine the temperature of the EUV-reflective element by calculation of the thermal behaviour of the EUV-reflective system, taking into account the heating of the system which is caused by the cleaning. In case that the cleaning is performed during the exposure process, the heating caused by the exposure light has also to be taken into account for this calculation. The calculation may further be supported by temperature measurements which have been performed beforehand. The time duration of the cleaning pulses and the time duration between subsequent cleaning pulses which have to be used to keep the temperature of the optical surface below the critical temperature depends on several parameters, e.g. the dimensions and weight of the specific EUV-reflective optical element as well as the maximum allowed temperature of the optical element including the heating caused by the exposure light, all of which may differ considerably among the optical elements of an EUV lithography system. The person skilled in the art will appreciate that the time duration of the cleaning gas pulses and the time duration between subsequent cleaning gas pulses may be modified during the cleaning for taking changes of the conditions inside of the EUV lithography system into account.

In another highly preferred variant the time duration of the cleaning gas pulses and the time duration between subsequent cleaning gas pulses are controlled such that generation of hydrogen-induced outgassing products is prevented. Hydrogen-induced outgassing (HIO) products are generated in a chemical reaction with components which are susceptible of forming volatile compounds with atomic hydrogen. Such components are e.g. solder joints which comprise metallic substances such as tin or zinc, forming tin hydride and zinc hydride, respectively, when being brought into contact with atomic hydrogen. The problem with these and other hydrogen-induced outgassing products is that they may be transported to the optical surface of the EUV-reflective optical element where the bare material, e.g. zinc or tin, is deposited as an irreversible contamination. Therefore, the production of such hydrogen-induced outgassing products should be avoided. The approach which is described herein to avoid the production of these HIOs makes use of the fact that in most cases, materials inside of the vacuum environment where the EUV-reflective optical element is arranged are present as oxides. In almost all cases, a jet of atomic hydrogen is capable of reducing these oxides, such that the bare material may evaporate or it may form a hydride with the atomic hydrogen, the likelihood of either path being determined by the vapor pressure of the hydride and of the bare, typically metallic material. As hydrogen-induced outgassing products typically generate irreversible contaminations on the optical surface of the EUV-reflective optical element (see above), in the presence of materials such as Sn, Zn, Mn, Na, P, S, Si etc. having a low vapor pressure, a pulsed cleaning strategy is advantageous, as the process of reducing an oxide layer on such materials susceptible of producing HIO products using a jet of atomic hydrogen takes a certain amount of time. When using pulsed cleaning, the time duration of the cleaning gas pulses may be controlled such that the oxide layers on those materials are not entirely removed and the time duration between the cleaning gas pulses may be chosen long enough such that the oxide layer can be restored. In such a way, it is possible to perform hydrogen cleaning also in case that components susceptible of generating hydrogen-induced outgassing products are located at or in the vicinity of the EUV-reflective optical element.

In a highly preferred variant, the cleaning gas is generated by activating a supply gas, the generation rate of the cleaning gas being controlled by adjusting the activation rate of the supply gas, preferably in a pulsed manner. In this case, the cleaning gas is generated by activation of a supply gas, preferably molecular hydrogen, by bringing the supply gas in an excited (electron) state, or by dissociation, thus producing radicals or ions, as described e.g. in the publication US 2003/0051739 A1, which is incorporated herein by reference in its entirety.

One example of such an activation process is the generation of atomic hydrogen from molecular hydrogen using electrons as an activation means. The activation of the supply gas is preferably done in a pulsed manner, i.e. alternately using a first time period during which the activation is performed and a second time period during which no activation is performed. For example, during a duty cycle, the activation may be performed during a first time period, e.g. 10 min, after which the activation may be stopped and the system is allowed to cool down again during a second time period, e.g. 20 min. This duty cycle can be optimized for a given layout of the EUV-lithography system. In the case described above, the generation rate of the cleaning gas can be controlled even though the supply gas is provided with constant pressure and flow rate.

In a preferred variant, a heated filament is used for activating the supply gas, and for adjusting the activation rate, the temperature of the filament is controlled. The filament is heated for producing electrons by thermo-emission. The electrons emitted from the filament may be accelerated in an electrical field and used to activate the supply gas. Preferably, the filament is operated in a pulsed manner, i.e. switched on and held at a given temperature during a first time period and switched off during a second time period of the duty cycle in which not only the heat produced by the cleaning process, but also the heat produced by the filament is no longer present in the EUV-lithography system. The given temperature may be set in dependence of the environment of the EUV-reflective optical element inside the EUV-lithography system, i.e. it may vary in dependence of the position of the EUV-reflective element. It is understood that the activation rate may also be controlled by modifying the temperature of the filament in a continuous instead of a pulsed manner.

In a highly preferred variant, the generation rate of the cleaning gas is controlled by adjusting the flow rate of the supply gas, preferably in a pulsed manner. Thus, the flow rate of the supply gas can be used for influencing the generation rate of the cleaning gas. In this case, the filament or any other suitable device for activating the cleaning gas can be permanently switched on and still the generation rate can be controlled. Providing the supply gas in a pulsed manner is particularly advantageous, as the EUV-lithography system is operated under vacuum conditions. Therefore, in those time periods during which no supply gas is provided, the non-activated part of the cleaning gas which is present at the optical surface will be transported away, such that when switching on the supply gas again, the cleaning gas will be transported fast because it is not hampered by diffusion in the background gas. In this case, the cleaning rate can be enhanced although the supply gas is switched off for a certain amount of time during the duty cycle. The person skilled in the art will appreciate that also in this case, the time duration of the cleaning gas pulses and the time duration between subsequent cleaning gas pulses may be controlled such that the transport of the cleaning gas to the contamination layer will not be limited by diffusion.

It is to be understood that both principles, i.e. pulsed activation and pulsed gas flow operation can be advantageously combined, i.e. by switching on the filament a few seconds before switching on the gas flow, and switching off the gas flow together with the filament. Moreover, both principles are also applicable to other cleaning gas production techniques, e.g. using RF. It is understood that the generation of the cleaning gas may be performed either off-line (i.e. during down time) or on-line (during normal operation of the EUV system), and that the pulsing strategy is useful in both cases. In particular, for on-line cleaning, pulsing may have the additional advantage that the average carbon cleaning rate and average carbonization rate (due to exposure to EUV light) can be balanced.

In a further preferred variant, the pressure of the supply gas is chosen to be in a range from $10^{-3}$ mbar to 1 mbar, preferably in a range from 0.05 mbar to 0.5 mbar, more preferably in a range from 0.1 mbar to 0.2 mbar. Under these conditions, which are preferably used for the cleaning, the transport rate of the cleaning gas (and also of the non-activated supply gas) to the surface of the EUV-reflective element is limited by diffusion, such that, as described above, using a pulsed gas flow is particularly advantageous.

In a further highly preferred variant, the cleaning gas is directed as a jet of cleaning gas to the contamination layer in a method for removing a contamination layer from an optical surface of an EUV-reflective optical element as described above, such that both methods may be advantageously combined.

A further aspect is implemented in a cleaning arrangement for at least partially removing a contamination layer from an EUV-reflective optical element, the cleaning arrangement comprising: a cleaning head for directing a jet of cleaning gas to the contamination layer for removing material from the contamination layer, a monitoring unit for monitoring the contamination layer for generating a signal indicative of the thickness of the contamination layer, at least one movement mechanism for moving the cleaning head relative to the optical surface, and a control unit for controlling the movement of the cleaning head using the signal indicative of the thickness of the contamination layer as a feedback signal. In the cleaning arrangement, control of the cleaning head is performed in dependence of the thickness of the contamination layer, thus allowing one to modify the cleaning process in dependence of the thickness of the contamination layer, in particular selecting different cleaning methods or cleaning gases in dependence of the thickness of the contamination layer. Moreover, the location of the impact zone of the jet of cleaning gas as well as its size and shape may be controlled in dependence of the thickness of the contamination layer. In particular, by an appropriate movement of the cleaning head, the cleaning of areas on the optical surface which are free from contaminations can be avoided.

In a preferred embodiment, the cleaning arrangement comprises at least one further cleaning head for directing a further jet of cleaning gas to the contamination layer. Using more than one cleaning head, the uniformity of the cleaning can be improved and the cleaning process can be speeded up, as the amount of cleaning gas per time unit which is available for the cleaning is increased. Moreover, the construction of the cleaning heads may be different, e.g. each cleaning head may be optimized for the production of a specific cleaning gas, or the generation mechanisms for the production of the cleaning gas may vary among the cleaning heads.

In a highly preferred embodiment, the monitoring unit comprises a spatially resolving detector for generating a map of the thickness of the contamination layer. By using a spatially resolving detector, the thickness distribution of the contamination layer can be determined, i.e. a three-dimensional map of the contamination layer can be generated by measuring the spatially resolved reflectance of monitoring light from the optical surface.

In a further preferred embodiment, the monitoring unit comprises at least one light source, electron source or ion source for directing monitoring light, monitoring electrons or monitoring ions to the optical surface. The light source may be designed to produce monitoring light in a directed manner, which is the case, for example, with LEDs. In this case, the monitoring light can be directed to several points on the optical surface with the same angle of incidence, e.g. by using a beam splitter or optical guides, e.g. fibers etc. In case that a light source emitting light into different directions is used, the angle of incidence may vary depending on the location on the optical surface. As the relationship between the thickness of the contamination layer and the intensity of the reflected light is dependent on the incidence angle, in each monitored surface point, the incidence angle has to be taken into account for producing the correct value of the thickness of the contamination layer. For details of the monitoring process, reference is made to German patent publication DE 10 2007 037 942.2 by the applicant, which is incorporated herein by reference in its entirety. Alternatively or in addition, the monitoring unit may comprise an electron source or an ion source which may be used to perform electron spectroscopy or ion spectroscopy, respectively.

In another preferred embodiment, the movement mechanism comprises at least one translatory drive for displacing the cleaning head in the direction of at least one axis. By translation of the cleaning head in at least two directions, the position of the cleaning head and thus the impact zone of the jet of cleaning gas on the contamination layer may be varied in a scanning manner.

In a further preferred embodiment, the movement mechanism comprises a tilting mechanism for tilting the cleaning head relative to the optical surface. The tilting mechanism allows changing the direction, i.e. rotating the jet of cleaning gas relative to the optical surface. When a jet of cleaning gas with a relatively small impact zone is used, also in this case, the cleaning may be performed in a scanning manner. As less space is required inside the EUV system for tilting the cleaning head during the cleaning process compared to displacing the cleaning head with a translatory drive, this embodiment is especially suited for in-operando cleaning, as the cleaning head does not have to cross the optical path for performing the cleaning.

In a further preferred embodiment, the control unit is designed to control the movement of the cleaning head in a scanning manner, thus allowing cleaning of the optical surface in a systematic and more uniform way.

A further aspect is implemented in a cleaning gas generation arrangement, comprising: a cleaning gas generator for generating a jet of cleaning gas to be directed to a contamination layer on an optical surface of an EUV-reflective optical element, and a control unit for controlling the generation rate of the cleaning gas in a pulsed manner, the time duration of the cleaning gas pulses and the time duration between subsequent cleaning gas pulses being controlled such that the cleaning of the EUV-reflective optical element is optimized.

In a preferred embodiment, the control unit controls the time duration of the cleaning gas pulses and the time duration between subsequent cleaning gas pulses such that a maximum temperature at or in the vicinity of the EUV-reflective element is not exceeded. In such a way, damage of the optical surface by heating up the optical surface due to the reaction of the cleaning gas with the contamination layer can be avoided. Moreover, in such a way, it is possible to avoid imaging errors which may be caused by local expansion of the multilayer system and/or the substrate of the EUV-reflective element. As discussed in greater detail above, the temperature may be determined by a calculation which may be based on data received in previous measurements. For a precise determination of the temperature during the cleaning process, the cleaning arrangement preferably further comprises a temperature sensor for detecting the temperature at or in the vicinity of the EUV-reflective element.

Preferably, the control unit controls the time duration of the cleaning gas pulses and the time duration between subsequent cleaning gas pulses such that generation of hydrogen-induced outgassing products is prevented. As described in greater detail above, this can be done by choosing the duration of the cleaning gas pulses sufficiently short for preventing the removal of oxide layers on components which are susceptible of outgassing hydrogen-induced outgassing products, and by choosing the duration between the cleaning gas pulses sufficiently long for regrowing of the oxide layers. Preferably, the growth of the oxide layer is accelerated by an oxidizing agent such as oxygen gas or water vapor which is brought into contact with the component, in particular in a localized manner preferably in time slots when no illumination occurs (EUV light off conditions). In order to check that the cleaning is correctly performed, a gas detector, e.g. a mass spectrometer, may be provided, the cleaning gas pulse being switched off immediately when the gas detector detects outgassing products. The time duration of the cleaning pulses and the time duration between subsequent cleaning pulses which have to be used to prevent generation of hydrogen-induced outgassing products may depend on several parameters, e.g. the type of the oxide, the thickness of the oxide layer etc., which may differ considerably in dependence of the type and material of the component which is susceptible of generating hydrogen-induced outgassing products.

In a highly preferred embodiment, the cleaning gas generator comprises an activation unit for generation of the cleaning gas by activation of a supply gas, the control unit being designed to control the generation rate of the cleaning gas by adjusting the activation rate of the supply gas, preferably in a pulsed manner. Preferably, the activation unit comprises at least one heated filament, the control unit being designed to control the temperature of the filament for adjusting the activation rate. For this purpose, a current through the filament can be controlled in such a way that a desired temperature and thus emission current is produced. In addition, the difference between the potentials of the filament and of a counter-electrode may be adjusted for influencing the acceleration of the electrons and thus the activation rate.

In a further preferred embodiment, the cleaning gas generation arrangement comprises a supply gas provision unit, the control unit being designed to control the flow rate of the supply gas which is fed from the supply gas provision unit to the activation unit, preferably in a pulsed manner. The flow rate of the supply gas may be set using a variable pump for pumping the supply gas from a gas reservoir to the activation unit.

In yet another preferred embodiment, the supply gas provision unit is designed to provide the supply gas at a pressure in a range from $10^{-3}$ mbar to 1 mbar, preferably in a range from 0.05 mbar to 0.5 mbar, more preferably in a range from 0.1 mbar to 0.2 mbar. In a vacuum chamber with a partial pressure of the supply gas, preferably hydrogen, in the above range, the flow of the cleaning gas to the optical surfaces is limited by diffusion. Therefore, by providing the supply gas in a pulsed manner, the cleaning process can be speeded up, as discussed in greater detail above.

A further aspect is implemented in a EUV-lithography system for imaging a structure on a photomask onto a light-sensitive substrate, comprising: at least one EUV-reflective optical element, at least one cleaning arrangement as described above and/or at least one cleaning gas generation arrangement as described above. It is to be understood that the cleaning arrangement and the cleaning gas generation arrangement can be advantageously combined, the cleaning gas generation arrangement being used to generate the jet of cleaning gas which is then controlled by the cleaning arrangement. When combining the two arrangements, only a single control unit may be used. Preferably, the cleaning/cleaning gas generation arrangements of different EUV-reflective elements are of a different construction, being adapted to the specific EUV-reflective elements for which they are employed.

In a highly preferred embodiment, the EUV-lithography system comprises a EUV light source, the EUV-reflective element being arranged in an optical path of the EUV light source, the monitoring unit and/or the cleaning head being arranged outside of the optical path. In this way, in-situ cleaning of the EUV-reflective optical element can be performed. It is understood that when cleaning is performed during the downtime of the EUV-lithography system, one or more cleaning heads may also be moved into the optical path for performing the cleaning. However, when performing in-operando cleaning, none of the components required for the cleaning may be moved into the optical path, as the exposure process should not be adversely affected by the cleaning.

Further features and advantages are stated in the following description of exemplary embodiments, with reference to the figures of the drawing which shows significant details, and are defined by the claims. Individual features can each be used singly, or several of them can be taken together in any desired combination, in order to implement desired variations.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
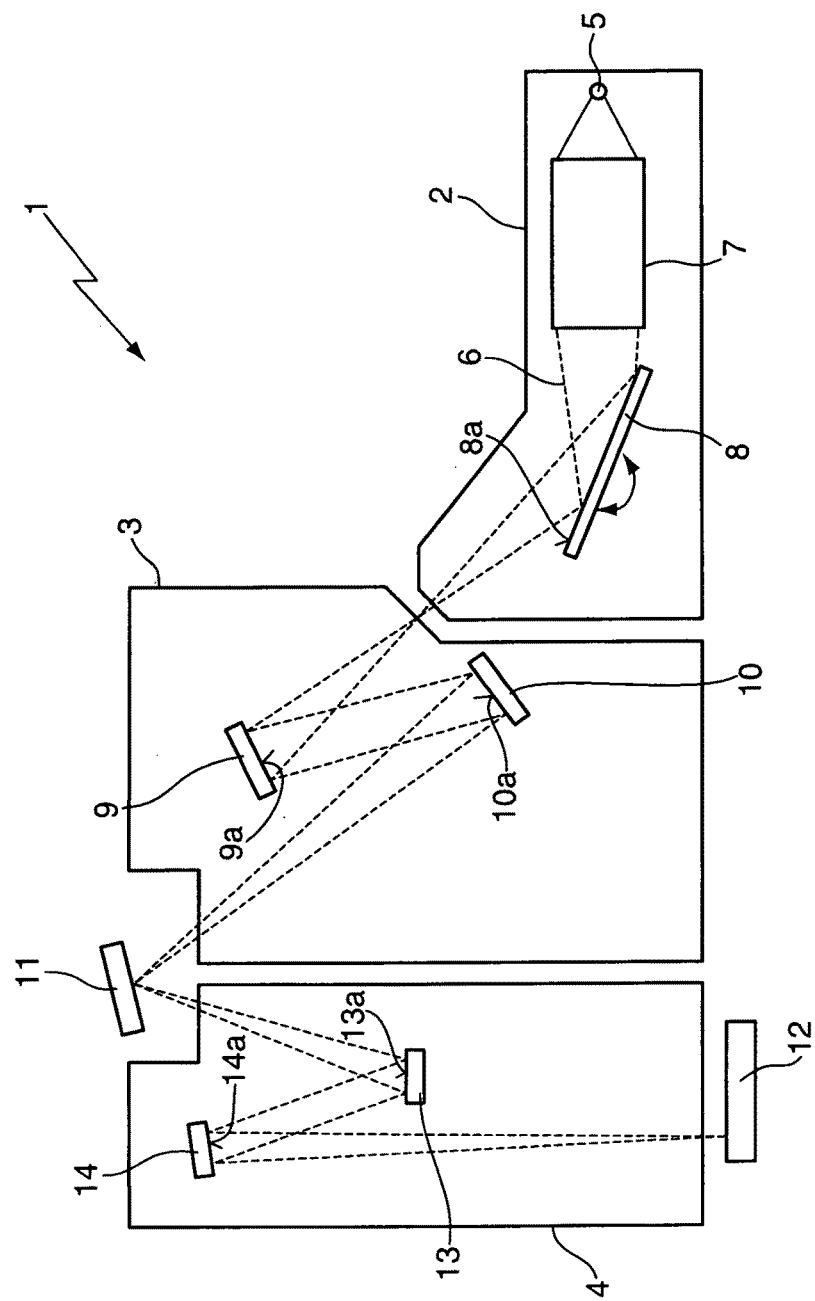
FIG. 1 is a schematic of an EUV-lithography system according to an embodiment of the invention.

FIG. 1 shows a schematic representation of a EUV-lithography system which is designed for manufacturing highly integrated semiconductor devices. The EUV-lithography system 1 comprises a beam shaping system 2, an illumination system 3 and a projection system 4, each of which is arranged in a separate vacuum compartment. The beam shaping system 2 comprises a EUV light source 5 which may be implemented as a plasma source or as a synchrotron source and emits EUV light which forms an optical path 6 through the EUV-lithography system 1. The EUV light emitted in a wavelength range of between 5 nm and 20 nm from the EUV light source 5 is first fed to a collimator 7 and subsequently, the desired operating wavelength for the exposure process (typically 13.5 nm) is selected by adjusting the incidence angle (see the double-headed arrow) of the EUV light which impinges on an optical surface 8a of a monochromator 8. The collimator 7 and the monochromator 8 are in general implemented as reflective optical elements.

The illumination system 3 serves to generate a homogeneous radiation distribution from the EUV-light which is provided by the beam shaping system 2 and comprises a first and second EUV-reflective optical element (9, 10), each having an optical surface (9a, 10a) positioned for reflecting the EUV light to a photomask 11 as a further EUV-reflective optical element which comprises a pattern which is imaged in a reduced scale onto a light-sensitive substrate of a wafer 12 by the projection system 4. For this purpose, the projection system 4 comprises a third and fourth EUV-reflective optical element (13, 14), each having a respective optical surface (13a, 14a) for directing the EUV light onto the wafer, the wafer 12 being arranged in an image plane of the projection system 4.

The EUV-reflective elements 8 to 11, 13 and 14 are subject to contamination due to impurities, e.g. by hydrocarbon molecules, which cannot be avoided even though the compartments 2 to 4 are operated under vacuum conditions. These hydrocarbon molecules react with the EUV light in the optical path 6 such that carbon deposits are generated on the optical surfaces 8a to 10a, 13a, 14a of the corresponding EUV-reflective elements 8 to 10, 13, 14. In the following, suitable arrangements will be described for removing the contamination from these surfaces, the arrangements not being represented in FIG. 1 for the sake of simplicity.

Figure 2:
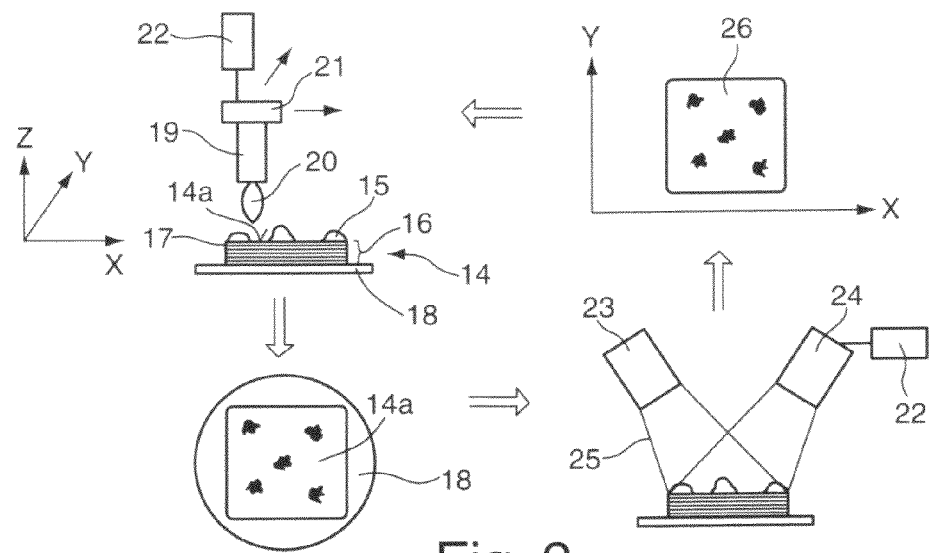
FIG. 2 is a schematic of an embodiment of a cleaning arrangement for cleaning one of the EUV-reflective elements of the EUV-lithography system of FIG. 1.

FIG. 2 shows that carbon deposits on the optical surface 14a of the fourth optical element 14 of the EUV-lithography system 1 of FIG. 1 form a contamination layer 15 on the optical surface 14a. The optical surface 14a is located on the topmost layer (cap layer) 17 of a multilayer system 16 having alternating molybdenum and silicon layers. The multilayer system 16 is arranged on a substrate 18 of the EUV-reflective element 14. For at least partially removing the contamination layer 15 from the optical surface 14a, a cleaning arrangement is provided in the EUV-lithography system 1. The cleaning arrangement comprises a cleaning head 19 which directs a jet 20 of atomic hydrogen as a cleaning gas to the contamination layer 15 for removing material from the optical surface 14a as shown in the upper left corner of FIG. 2.

The cleaning head 19 is mounted on a translatory drive 21 serving as a movement mechanism for displacing the cleaning head 19 relative to the optical surface 14a in a plane which is defined by first and second axes (X, Y). The movement of the translatory drive 21 and thus of the cleaning head 19 is controlled by a control unit 22 which is designed for moving the cleaning head 19 in a scanning manner over the optical surface 14a.

As shown in the lower left corner of FIG. 2, the contamination layer 15 is discontinuous and forms only small contaminating spots on the optical surface 14a, such that the jet 20 of cleaning gas has to be directed only to these spots for the removal of the contamination layer 15 in order to avoid damaging of the optical surface 14a by the cleaning gas. As a precise positioning of the cleaning head 19 is required in this case, the latter has a small spot size, i.e. a small impact zone on the optical surface 14a. It is understood that the size of the impact zone may be adjusted by moving the cleaning head 19 also along a third axis Z perpendicular to the optical surface. As the cleaning head 19 is displaced over the optical surface 14a in a scanning manner, the cleaning head 19 is necessarily brought into the optical path 6 shown in FIG. 1. Therefore, the exposure process has to be interrupted during the cleaning process.

In order to determine the correct locations on the optical surface 14a to which the jet 20 of cleaning gas has to be directed, the cleaning arrangement comprises a monitoring unit for inspecting the optical surface 14a and the contamination layer 15, respectively, shown in the lower right corner of FIG. 2. The monitoring unit comprises a monitoring light source 23 and a spatially resolving detector 24, both of which are arranged outside of the optical path 6 (shown in FIG. 1) so as not to disturb the exposure process. Monitoring light 25 is emitted by the monitoring light source 23 over a large solid angle covering the entire optical surface 14a and the reflected monitoring light 25 is detected in the spatially resolving detector 24. The intensity of the monitoring light reflected from the optical surface 14a is indicative of the thickness of the contamination layer 15. The thicker the contamination layer 15, the smaller the amount of monitoring light reflected from the optical surface 14a. The intensity signal produced by the detector 24 is fed to the control unit 22 operatively coupled to the detector 24. The control unit 22 generates a three-dimensional map 26 of the optical surface, a two-dimensional sectional view of which is shown in the upper right corner of FIG. 2. By generating a three-dimensional map, it is not only possible to determine the location of the contaminating spots on the optical surface 14a, but also the thickness of the contamination layer 15 in these spots. This is possible as the control unit 22 is designed to calculate a thickness distribution from the spatially resolved intensity distribution of the detector 24 by using a known (e.g. determined by prior measurements) correlation between the intensity of the reflected monitoring light 25 and the thickness of the contamination layer 15. In particular, for generating the three-dimensional map 26, the dependence of the correlation on the angle of incidence of the monitoring light 25 on the optical surface 14a has to be taken into account, as described in detail in DE 10 2007 037 942.2 by the applicant. In particular, in order to increase the sensitivity of the measurement, it is advisable to choose a wavelength of the monitoring light 25 in which the change of the intensity signal within a given thickness range of the contamination layer 15 can be maximized for a given angle of incidence, which is possible e.g. when choosing a wavelength in the visible domain, i.e. in a wavelength range from 400 nm to 800 nm.

The information about the thickness distribution of the contamination layer 15 on the optical surface 14a can not only be used to direct the cleaning head 19 to the correct locations on the optical surface 14*a*, but also to adjust the cleaning time, i.e., the time in which the jet 20 of cleaning gas has to be directed to a particular location on the optical surface 14*a* for entirely removing the contamination layer 15 through online monitoring of the reduction of the thickness of the contamination layer 15.

The person skilled in the art will appreciate that instead of using atomic hydrogen as a cleaning gas, also other suitable cleaning gases may be employed, such as atomic nitrogen, halogenides (Br, I, etc.), oxygen radicals, argon radicals, hydrogen radicals, neon radicals, helium radicals, krypton radicals, pure gas plasmas and their mixtures, in particular argon plasma and oxygen plasma. The construction of the cleaning head 19 may be adapted to the cleaning gas used, or may be adapted for the use of more than one cleaning gas which are then provided to the cleaning head in turn. In particular, the choice of the cleaning gas or of the cleaning method may vary depending on the thickness of the contamination layer, as will be described in the following with respect to FIG. 3.

Figure 3:
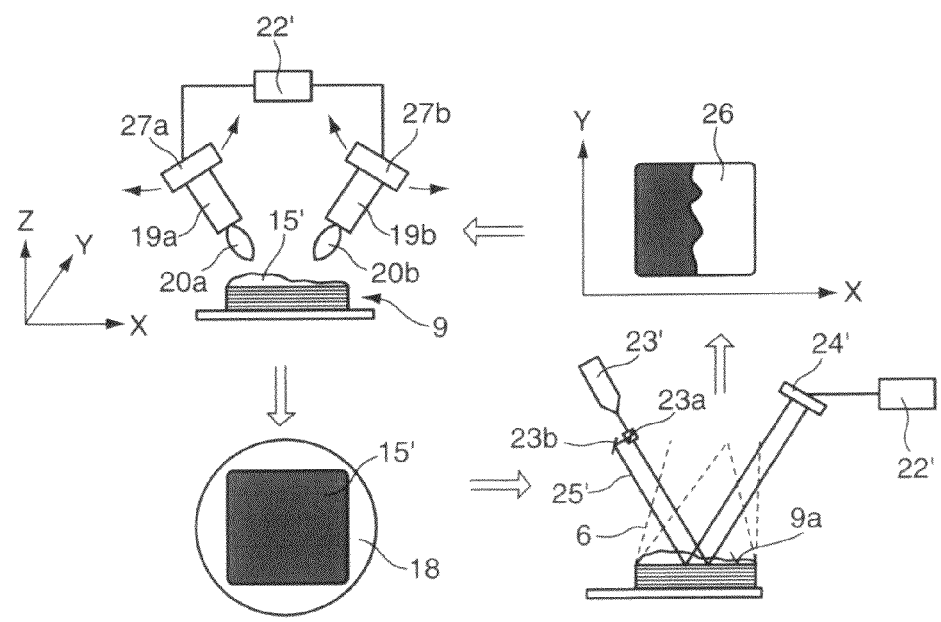
FIG. 3 is a schematic of a further embodiment of a cleaning arrangement for cleaning a further EUV-reflective element of the EUV-lithography system of FIG. 1.

FIG. 3 shows the first EUV-reflective optical element 9 of FIG. 1 together with a further cleaning arrangement being used to remove a contamination layer 15' from its optical surface 9*a*. The cleaning arrangement of FIG. 3 comprises two cleaning heads (19*a*, 19*b*) producing respective jets (20*a*, 20*b*) of cleaning gas. The cleaning heads (19*a*, 19*b*) are connected to respective tilting mechanisms (27*a*, 27*b*) for changing the direction of the jets (20*a*, 20*b*) of cleaning gas relative to the optical surface 9*a*. The tilting mechanism, e.g. a swivelable arm, is constructed in such a way that the jets (20*a*, 20*b*) of cleaning gas can reach any point on the optical surface 9*a* for performing the cleaning. In the example of FIG. 3, the contamination layer 15' is a continuous, relatively thick layer, having a thickness of about 15 nm in a surface area on the left-hand side, and a reduced thickness of less than 5 nm in a surface area close to the right-hand side. The first of the two cleaning heads 19*a* uses helium as a sputter gas for the cleaning, being more aggressive than atomic hydrogen which is used as cleaning gas in the second jet 20*b* of cleaning gas. In order to avoid damaging the optical surface, the first cleaning head 19*a* is used to reduce the thickness of the contamination layer 15' only up to a thickness of 5 nm, whereas the second cleaning head 19*b* is used to remove the remnant of the contamination layer 15'. For the sputtering, a potential difference between the EUV-reflective optical element 9 and the cleaning head 19*a* is generated by a voltage generator (not shown) for accelerating the helium ions in the jet 20*a* of cleaning gas directed to the optical surface 9*a*. It is understood that other sputter gases, e.g. hydrogen, helium, argon, neon, or krypton may be used as well. Alternatively or in addition, it is possible to remove the contamination layer up to a certain thickness, e.g. 5 nm, by other cleaning methods, including mechanical cleaning by contact methods, heating induced desorption, or chemical cleaning.

Of course, it is also possible for both cleaning heads (19*a*, 19*b*) to use the same cleaning gas for increasing the uniformity of the cleaning. It is understood that more than two cleaning heads may also be used for increasing uniformity, being preferably arranged equally spaced in a circumferential direction around the perimeter of the EUV-reflective optical element 9.

The cleaning arrangement shown in FIG. 3 differs from the one shown in FIG. 2 not only in the number of cleaning heads, but also in the way the three-dimensional map 26 of the contamination layer 15' is generated, a sectional view of which is shown in the upper right corner of FIG. 3. In the monitoring unit of FIG. 3, a laser diode is used as a light source 23' which emits monitoring light 25' in the visible wavelength region in a directed manner to the optical surface 9*a*, as shown in the lower right-hand corner. The monitoring light 25' from the light source 23' impinges on a beam splitter 23*a* which transmits a first portion of the monitoring light 25' to a first point on the optical surface 9*a* and reflects a second portion of the monitoring light 25' to a mirror 23*b* which reflects the second portion of the monitoring light 25' to a second point on the optical surface 9*a*. In this way, the monitoring light 25' impinges on the two points on the optical surface 9*a* at the same angle of incidence, such that no correction for the incidence angle is necessary for calculating the thickness from the intensity signal which is detected by a spatially resolving detector 24'. The person skilled in the art will appreciate that the number of points that the monitoring light 25' impinges on can be adjusted by using additional beam splitters or by using more than one monitoring light source. It is understood that reflectometry may be performed using light in the UV or EUV wavelength range.

The person skilled in the art will appreciate that the thickness of the contamination layer 15' may be monitored using a monitoring unit which may be designed in a variety of ways. It is e.g. possible to use a high-resolution camera with imaging optics for inspecting the optical surface 9*a*, the focus of the imaging optics being shifted for producing images of sectional views of the contamination layer 15' with varying distance from the optical surface 9*a*. Also, monitoring the thickness of the contamination layer 15' may be performed by measuring the photocurrent induced by EUV or UV radiation impinging on the optical surface 9*a*, or by classical surface analysis methods such as X-ray Photoelectron Spectroscopy (XPS), Scanning Electron Microscopy (SEM), and Auger Electron Spectroscopy (AES).

In the example of the cleaning arrangement shown in FIG. 3, the cleaning can be performed in-operando, as it is not necessary for the cleaning heads (19*a*, 19*b*) to be moved into the optical path 6 for removing the contamination layer 15'. As the first, EUV-reflective element 9 is exposed to EUV light with the highest intensity of all the EUV-reflective elements 9 to 11, 13, 14, the contamination layer 15' grows at an elevated rate, such that in-operando cleaning is particularly advantageous in this case to reduce downtimes of the EUV-lithography system 1.

It is understood that in addition to the tilting mechanism (27*a*, 27*b*), it is possible to use a movement mechanism which allows for displacing the cleaning heads (19*a*, 19*b*) in a translatory motion, and that the cleaning head 19 of FIG. 2 may also be provided with an additional tilting mechanism (not shown).

In the following, the generation of the jet 20 of cleaning gas shown in FIG. 2 is described with reference to FIG. 4, in which the cleaning head 19 is shown in greater detail. For generating the jet 20 of atomic hydrogen H•, the cleaning head 19 is connected to a hydrogen reservoir 29, e.g. a bottle or another suitable vessel for pressurized hydrogen, which may be arranged at a remote location inside or outside of the EUV-lithography system 1. The molecular hydrogen $H_2$ is fed from the hydrogen reservoir 29 via a supply gas provision unit 30 using a pump (not shown) at a constant pressure of about 0.1 mbar to the interior of the cleaning head 19, which comprises a filament 31 and a voltage generator 34 for generating an electrical field 33 between the filament 31 and a counter-electrode 34*a* to which the voltage generator 31 is operatively connected. The two ends of the filament 31 are connected to a power source 32 for heating the filament by passing an electrical current through the filament 31. The filament 31 together with the power supply 32, the voltage generator 34 and the counter-electrode 34a are used as an activation unit for the molecular hydrogen $H_2$, as they provide accelerated electrons which are used to crack the molecular hydrogen $H_2$ to atomic hydrogen H•, which is then used as a cleaning gas in the jet 20. It is understood that normally, not the entire supply gas can be activated in the way described above, such that apart from the cleaning gas, also part of the supply gas is provided to the jet 20.

In order to prevent excessive heating of the optical element 14, the control unit 22 is operatively connected to a temperature sensor 28 which measures the temperature T in the vicinity of the optical surface 14a. The control unit 22 is designed to control both the supply gas provision unit 30 (i.e. its pump power) for adjusting the flow rate of the molecular hydrogen $H_2$ and the power supply 32 for adjusting the temperature of the filament 31 by controlling the current through the filament 31 in dependence of the temperature T. Alternatively, the temperature close to the optical surface 14a may be determined by calculations which simulate the heat transfer inside of the EUV-lithography system 1, taking the heat which is generated by the cleaning into account.

Figure 5:
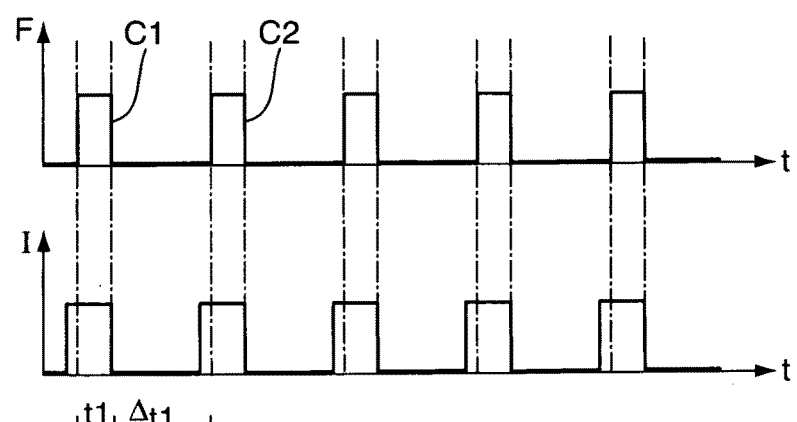
FIG. 5 is a diagrammatic view of the duty cycles of an activation unit and of a supply gas provision unit of the cleaning gas generation arrangement of FIG. 4.

The control unit 22 is used to maintain the temperature T near the optical surface 14a below a critical temperature $T_{MAX}$ which is about 60° C. for standard multilayer mirrors and about 200° C. for high-temperature multilayer mirrors, the latter usually comprising barrier layers for preventing interdiffusion between the individual layers, thus preventing the material of the multilayer system 16 from damage caused by the interdiffusion due to excessive heating. For the purpose of not exceeding the critical temperature $T_{MAX}$, the control unit 22 controls both the temperature of the filament 31 and the flow rate of the supply gas in a pulsed manner, using a duty cycle as shown in FIG. 5.

During the duty cycle, first the filament 31 is heated for several seconds by setting a current I through the filament 31 to a constant value. In this way, pre-heating of the filament 31 is achieved, so that the filament can be heated to a desired temperature before the gas flow is switched on and set to a flow rate F which is also constant. After a cleaning pulse C1 of a time duration t1 of about two minutes, both the current I and the flow rate F are set to zero by the control unit 22 for a time Δt1 of about four minutes. During this time, the vacuum pump (not shown), which produces a vacuum inside of the EUV-lithography system 1, pumps away the re-combined or non-activated cleaning gas as well as the mixture of gases produced by the reaction of the atomic hydrogen with the carbon from the contamination layer 15. Therefore, when the filament 31 and the flow of cleaning gas are switched on once again, producing a further cleaning pulse C2 when starting a subsequent duty cycle, the flow of the cleaning gas to the optical surface 14a is fast, as it is not hampered by diffusion in the background hydrogen gas present at the optical surface 14a during the cleaning, which has a partial pressure of about 0.1 mbar (corresponding essentially to the pressure of the hydrogen gas $H_2$ from the gas provision unit 30) and therefore limits the transport rate of the atomic hydrogen H• to the optical surface 14a. Therefore, by pulsed production of the cleaning gas, it is possible to speed up the cleaning process as well as to prevent overheating of the optical surface 14a. The person skilled in the art will appreciate that the time durations (t1, Δt1) given above are only exemplary values and may modify these values to make them fit to the conditions of each individual EUV reflective element within the EUV lithography system which is to be cleaned.

It is understood that by increasing the hydrogen flow over the hot filament and/or heating the filament to higher temperatures, a greater fraction of the supply gas $H_2$ is activated and that consequently, the cleaning can be speeded up as well, which may be particularly useful when the exposure process is interrupted during the cleaning. However, as e.g. heating the filament to higher temperatures also leads to an increased heating of the environment, a compromise must be made between the cleaning speed and the heating. For EUV-reflective elements which are efficiently cooled, e.g. by using water as a cooling fluid, the filament may be heated to higher temperatures, which is especially desirable when cleaning is performed on EUV-reflective optical elements such as the first or second EUV-reflective optical element (9, 10) of the illumination system 3 which in general exhibit a contamination layer having a relatively large thickness. For the third and fourth EUV-reflective optical elements (13, 14) of the projection system 4, heating is more critical and less contamination is expected, such that the temperature of the filament may be set to a lower value in this case. In any case, when performing pulsed cleaning, during the exposure process, the contamination growth and the removal rate of the contaminations can be balanced, such that the contamination level of the EUV-reflective optical elements can be kept constant during the exposure.

Figure 4:
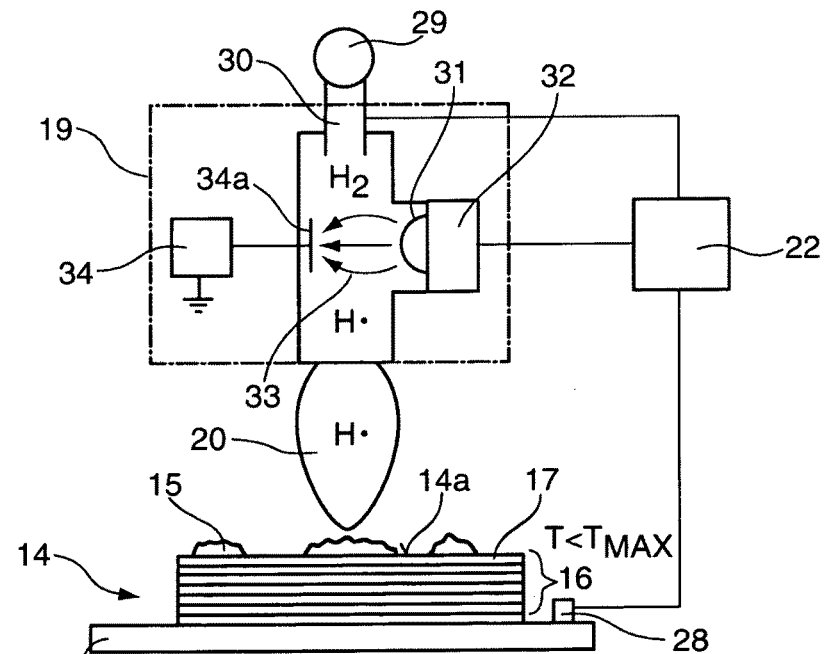
FIG. 4 is a schematic of an embodiment of a cleaning gas generation arrangement for the generation of atomic hydrogen.
Figure 6:
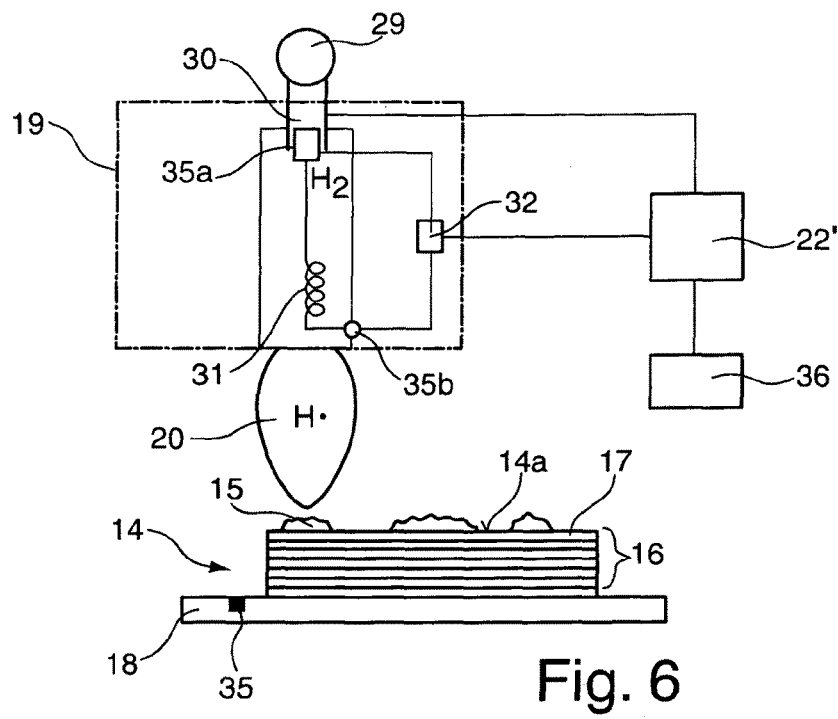
FIG. 6 is a schematic of a further embodiment of a cleaning gas generation arrangement; and, FIG. 7 is a diagrammatic view of the duty cycles of the cleaning gas generation arrangement of FIG. 6.

FIG. 6 shows an arrangement which differs from the one shown in FIG. 4 in that the cleaning head 19 does not comprise an entity which generates an electrical field. The supply gas is passed over the filament 31 being heated to temperatures of approximately 2000° C. which are sufficient to crack the molecular hydrogen $H_2$ to form atomic hydrogen H•. For the purpose of heating, the power source 32 is connected to both ends (35a, 35b) of the filament 31. In the arrangement shown in FIG. 6, heating is less critical, as a cooling unit (not shown) is used for cooling the EUV-reflective optical element 14, such that the current I through the filament 31 is kept constant at a temperature of about 2000° C. during the cleaning, as shown in FIG. 7 which also represents the flow rate F of the cleaning gas.

The arrangement of FIG. 6 further differs from the arrangement of FIG. 4 in that a component 35, which is susceptible of generating hydrogen-induced outgassing products in the form of a solder comprising zinc (Zn) or tin (Sn), is arranged on the substrate 18 of the EUV-reflective optical element 14. The cleaning head 19 is arranged at a distance of e.g. about 100 mm from the substrate 18 and as the component 35 is located close to the optical surface 14a to be cleaned, part of the cleaning gas from the jet 20 of cleaning gas is brought into contact with the component 35 and reduces an oxide layer (not shown) on top of the component 35. As, after the removal of the entire oxide layer, the bare material may evaporate, or it may form a hydride with the atomic hydrogen (forming a hydrogen-induced outgassing product) which typically generates irreversible contaminations when deposited on the optical surface 14a of the EUV-reflective optical element 14, in the presence of materials such as Sn, Zn, Mn, Na, P, S, Si etc. having a low vapor pressure close to the optical surface 14a, a pulsed cleaning strategy is advantageous, as the process of reducing the oxide layer on e.g. the component 35 takes a certain amount of time. In the pulsed cleaning, the time duration t2 (a few minutes, e.g. ten minutes) of the cleaning gas pulse C1 is controlled such that the oxide layer on the component 35 is not entirely removed and the time duration Δt2 (e.g. about 20 minutes) between the cleaning gas pulse C1 and the subsequent cleaning gas pulse C2 is selected long enough such that the oxide layer on the component 35 can be restored, a process which may be accelerated by locally introducing an oxidizing agent close to the component 35. By using pulsed cleaning in the way described above, it is possible to perform hydrogen cleaning also in case that components susceptible of generating hydrogen-induced outgassing products are located at or in the vicinity of the EUV-reflective optical element. To make certain that no hydrogen-induced outgassing products are generated during the cleaning process, a gas detector 36 in form of a mass spectrometer is connected to the control unit 22', such that the cleaning gas jet 20 can be switched off immediately in case that hydrogen-induced outgassing products such as tin, zinc or their hydrides are detected. In this way, the initiation of the restoration of the oxide layer can be triggered by the detection of outgassing products.

Figure 7:
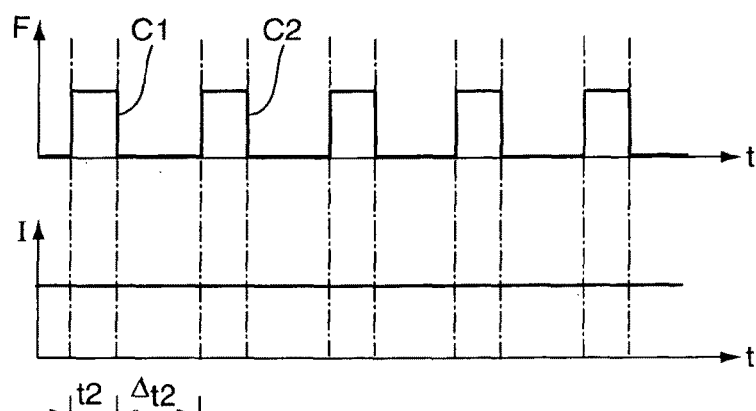

The person skilled in the art will appreciate that instead of using cleaning gas pulses (C1, C2) with a rectangular shape as shown in FIG. 5 and FIG. 7, cleaning gas pulses of a different pulse shape may also be used for the cleaning, the time duration of these pulses being defined as usual in this case as full width at half maximum.

By the arrangements and methods described above, the contamination layers (15, 15') may be entirely removed from the optical surfaces (9a, 14a) in a very efficient way without damaging the material of the multilayer system 16. However, instead of entirely removing the contamination layer 15' from the optical surface 14a, it is possible to remove only part of this layer, i.e. to generate a contamination layer of a desired shape through the cleaning, the shape of the contamination layer being adapted for the generation of a desired optical property of the EUV-lithography system 1, e.g. by optimizing its telecentricity. The control unit 22' or a further calculation unit (not shown) may be designed to calculate the desired shape of the contamination layers on the EUV-reflective optical elements 9 to 11, 13, 14 based on measurements of the optical properties of the EUV-lithography system 1 which may be performed e.g. by measuring the intensity distribution of the EUV radiation at the wafer level using appropriate sensors (e.g. so-called slit sensors). However, for the discontinuous contamination layer 15 shown in FIG. 2, there is not enough material to generate of a desired shape, such that the contamination layer 15 is entirely removed from the optical surface 14a.

Apart from carbon, other contaminating substances may be deposited on EUV-reflective optical elements as well, such as contaminants outgassing from a photoresist on the wafer 12, e.g. sulphur compounds or metal hydrides released from the EUV source or from special materials during cleaning. The person skilled in the art will appreciate that such contaminants may also be efficiently removed or avoided by using the methods and arrangements as described above.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

It is understood that the foregoing description is that of the preferred embodiments of the invention and that various changes and modifications may be made thereto without departing from the spirit and scope of the invention as defined in the appended claims.

What is claimed is:

1. A cleaning gas generation arrangement for cleaning an EUV-reflective optical element defining an optical surface on which a contamination layer can form, the arrangement comprising:
a cleaning gas generator for generating a jet of cleaning gas directed to the contamination layer on said optical surface of said optical element;
a control unit for controlling the generation of said cleaning gas as a sequence of pulses thereof; and,
said control unit being configured to control the time duration of said pulses and the time duration between said pulses so as to optimize the cleaning of said optical element,
wherein said control unit is configured to control the time duration of said pulses and the time duration between said pulses such that a maximum temperature ($T_{MAX}$) at or in the vicinity of said optical element is not exceeded.

2. The cleaning gas generation arrangement of claim 1, wherein the control unit is configured to control said time duration of said pulses and the time duration between said pulses so as to prevent a generation of hydrogen-induced outgassing products.

3. The cleaning gas generation arrangement of claim 2, further comprising a gas detector for detecting hydrogen-induced outgassing products.

4. The cleaning gas generation arrangement of claim 1, wherein said arrangement further comprises a source of supply gas; said cleaning gas generator further comprises an activation unit for generating said cleaning gas by activating said supply gas; and, said control unit is configured to control the rate of generation of said cleaning gas by adjusting the rate of activation of said supply gas.

5. A method for generating a jet of cleaning gas to be directed to a contamination layer on an optical surface of an EUV-reflective optical element, the method comprising the step of:
controlling the rate of generation of said cleaning gas as a sequence of pulses thereof by controlling the time duration of said pulses and the time duration between said pulses so as to optimize the cleaning of said optical element,
wherein the time duration of said cleaning gas pulses and the time duration between said cleaning gas pulses is controlled such that a maximum temperature ($T_{MAX}$) at or in the vicinity of said optical element is not exceeded.

6. The method of claim 5, wherein the time duration of said cleaning gas pulses and the time duration between said cleaning gas pulses is controlled so as to prevent a generation of hydrogen-induced outgassing products.

7. The method of claim 5, comprising the further steps of:
providing a supply gas;
generating said cleaning gas by activating said supply gas; and,
controlling the rate of generation of said cleaning gas by adjusting the rate of activation of said supply gas.

8. The method of claim 5, comprising the further steps of:
providing a supply gas;
applying a heated filament to activate said supply gas; and,
controlling the temperature of said filament for adjusting the rate of activation of said supply gas.

* * * * *